United States Patent
Kim

(10) Patent No.: US 7,068,527 B2
(45) Date of Patent: *Jun. 27, 2006

(54) MATCH LINE SENSING AMPLIFIER FOR CONTENT ADDRESSABLE MEMORY

(75) Inventor: Hong-Seok Kim, Sunnyvale, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/043,437

(22) Filed: Jan. 27, 2005

(65) Prior Publication Data

US 2005/0152168 A1    Jul. 14, 2005

Related U.S. Application Data

(63) Continuation of application No. 10/629,830, filed on Jul. 30, 2003, now Pat. No. 6,856,528.

(51) Int. Cl.
*G11C 15/00*    (2006.01)

(52) U.S. Cl. .................. 365/49; 365/203; 365/207; 711/108

(58) Field of Classification Search ............... None
See application file for complete search history.

(56) References Cited

U.S. PATENT DOCUMENTS

| | | | |
|---|---|---|---|
| 6,430,073 B1 * | 8/2002 | Batson et al. .......... | 365/49 |
| 6,442,090 B1 | 8/2002 | Ahmed et al. | |
| 6,535,426 B1 * | 3/2003 | Michael et al. ........ | 365/185.2 |
| 6,584,003 B1 | 6/2003 | Kim et al. | |
| 6,697,277 B1 * | 2/2004 | Towler et al. ......... | 365/49 |
| 6,856,528 B1 * | 2/2005 | Kim ...................... | 365/49 |

OTHER PUBLICATIONS

E. Seevinck, P.J. van Beers and H. Ontrop, "Current-Mode Techniques for High-Speed VLSI Circuits with Application to Current Sense Amplifier for CMOS SRAM's," IEEE J. Solid-State Circuits, vol. 26, No. 4, pp. 525-536, Apr. 1991.
B. Wicht, D. Schmitt-Landsiedel, and S. Paul, "A Simple Low Voltage Current Sense Amplifier with Switchable Input Transistor," ESSCIRC 2001, Proc. of the 27$^{th}$ European Solid-State Circuits Conference, Villach, Austria, pp. 300-303, Sep. 18-20, 2001.

* cited by examiner

*Primary Examiner*—David Lam
(74) *Attorney, Agent, or Firm*—Dickstein Shapiro Morin & Oshinsky LLP

(57) ABSTRACT

A method and apparatus for sensing a state of a memory circuit, in particular a content address memory (CAM) device are described. The method includes receiving a first current signal as an input, the first current signal corresponding to a state of the memory circuit, converting the first current signal into a first voltage signal, converting the first voltage signal into a second voltage signal and sensing the second voltage signal. The apparatus includes an input adapted to receive a first current signal, the first current signal corresponding to the state of the memory circuit; and a current mirror circuit having a first portion adapted to receive the first current signal and convert the first current signal to a first voltage signal and a second portion adapted to receive the first voltage signal and convert the first voltage signal into a second voltage signal as an output.

11 Claims, 8 Drawing Sheets

MATCH LINE SENSING AMPLIFIER FOR CONTENT ADDRESSABLE MEMORY

This application is a continuation of U.S. patent application Ser. No. 10/629,830, filed on Jul. 30, 2003, now U.S. Pat. No. 6,856,528, which is incorporated herein by reference.

FIELD OF THE INVENTION

The present invention relates generally to a content addressable memory (CAM) device, and in particular, to a system and method for increasing the match line sense amplifier speed in a CAM device.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A conventional CAM is viewed as a static storage device constructed of modified RAM cells. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in a comparand register) against the entire list of pre-stored entries. As a result of their unique searching algorithm, CAM devices are frequently employed in network equipment, particularly routers, gateways and switches, computer systems and other devices that require rapid content searching, such as routing data or tables for data networks or matching URLs. Some of these tables are "learned" from the data passing through the network. Other tables, however, are fixed tables that are loaded into the CAM by a system controller. These fixed tables reside in the CAM for a relatively long period of time. A word in a CAM is typically large and can be 72 bits or more.

In order to perform a memory search in the above-identified manner, CAMs are organized differently than other memory devices (e.g., DRAM and SRAM). For example, data is stored in a RAM in a particular location, called an address. During a memory access, the user supplies an address and reads from or gets back the data at the specified address. In a CAM, however, data is stored in locations in a somewhat random fashion. The memory storage locations can be selected by an address bus, or the data can be written into the first empty memory storage location. Every memory storage location stores additional information to keep track of whether the memory storage location is storing valid information or is empty and available for writing.

Once information is stored in a memory storage location, it is found by comparing every bit stored in the storage location with data in the comparand register. When the contents stored in the CAM memory storage location do not match the data in the comparand register, a local match detection circuit returns a no match indication. When the contents stored in the CAM memory storage location match the data in the comparand register, the local match detection circuit returns a match indication. If one or more local match detect circuits return a match indication, the CAM device returns a "match" indication. Otherwise, the CAM device returns a "no-match" indication. In addition, the CAM may return the identification of the address/memory storage location in which the desired data is stored or one of such addresses, such as a highest priority match address, if more than one corresponding CAM storage location contained matching data. Thus, with a CAM, the user supplies the data and gets back an address if there is a match.

For high CAM look-up throughput rates, the incoming data is compared with all CAM entries in parallel, resulting in high power consumption. In some power saving schemes, individual entries can be programmed to never match, or banks of entries can be enabled or disabled.

TCAMs (i.e., ternary CAM devices) are similar to CAMs except that each bit in a CAM entry can also be programmed to match a 'don't care' or X value. When an incoming TCAM data word is compared with an entry, each match bit in the entry can be programmed to be one of a (0, 1, X), where X is a 'don't care' match value that matches a 0 or 1 in the corresponding bit on the incoming TCAM word. Of course, all the other bits have to match according to the (0, 1, X) pattern before a TCAM word match occurs. For example, programming a TCAM entry with all X's causes the entry to match all possible inputs. If there are N bits of value X in a word, then $2^N$ possible inputs will match that entry.

For each CAM or TCAM storage location match, time consuming electrical events occur. The first event is to precharge each match line associated with a CAM storage location to indicate a match. Then the match between the bits of the incoming word/comparand and the bits of each CAM storage location occurs. If all bits of a stored word match corresponding bits of a comparand word, then the match line remains charged. If any of the bits do not match, then the match line is pulled to ground. A match line sense amplifier senses the state of the match line. The speed of the sense amplifier is dependent upon sense speed and is a trade-off against power consumption. A number of attempts have been made to increase the speed of a match line sense amplifier.

For example, U.S. Pat. No. 6,442,090 entitled "Differential Sensing Amplifier for Content Addressable Memory" by Ahmed at al. describes a differential cross-coupled sense amplifier. FIG. 1 is an embodiment of Ahmed's cross-coupled differential sensing amplifier that requires a cascaded connection load, which varies, making sensing time selection difficult. The FIG. 1 amplifier 105 also needs to allow an extra noise margin in case of match line voltage fluctuations and an offset having a varying load.

FIG. 2 illustrates another sensing amplifier known in the art. In the FIG. 2 amplifier the current is low and semi-constant for all switching combinations. The amplifier, however, requires a control line, which further requires a shield line, each of which cause an increase in the CAM cell size. Match line power is conserved but the control line has a power loss. The current limit control also requires a band gap voltage reference control.

FIG. 3 shows a conventional current sensing amplifier having a common gate stage.

SUMMARY OF THE INVENTION

Embodiments of the present invention provide a hybrid current-voltage sense amplifier and its manner of operation. The sense amplifier uses a current mirror amplifier coupled to a match line, the latter of which has a signal condition indicating the result of a comparison of the bits of a stored word (cell) of a CAM with the bits of a comparand word.

The sensing amplifier monitors a current, which is affected by current flow on the match line at a first leg of the current mirror circuit and uses this monitored current to produce a voltage at the first leg. This voltage is applied to a second leg of the current mirror circuit, which produces an output voltage indicating the logic state of the match line.

These and other features of the invention will be more clearly understood from the following detailed description, which is provided in connection with the accompanying drawings.

DETAILED DESCRIPTION OF THE INVENTION

Figure 1:
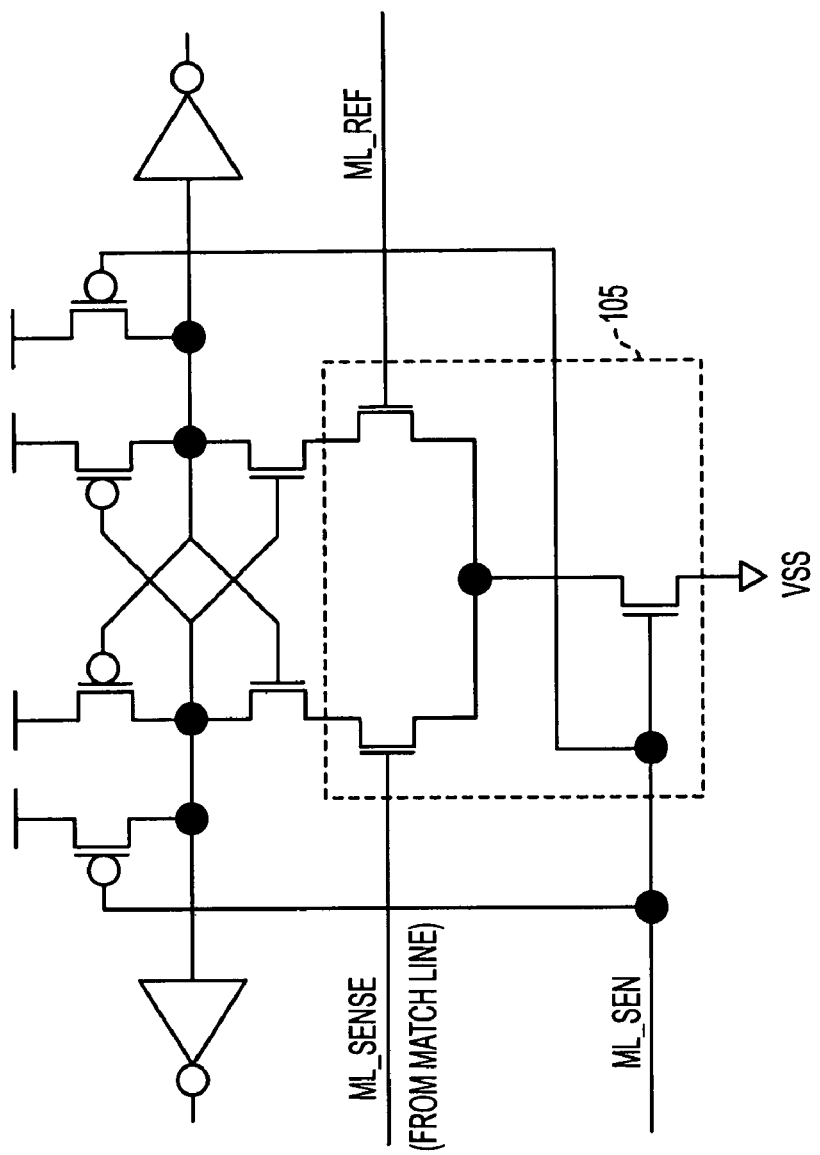
FIG. 1 is a prior art cross-coupled differential sensing amplifier.
Figure 2:
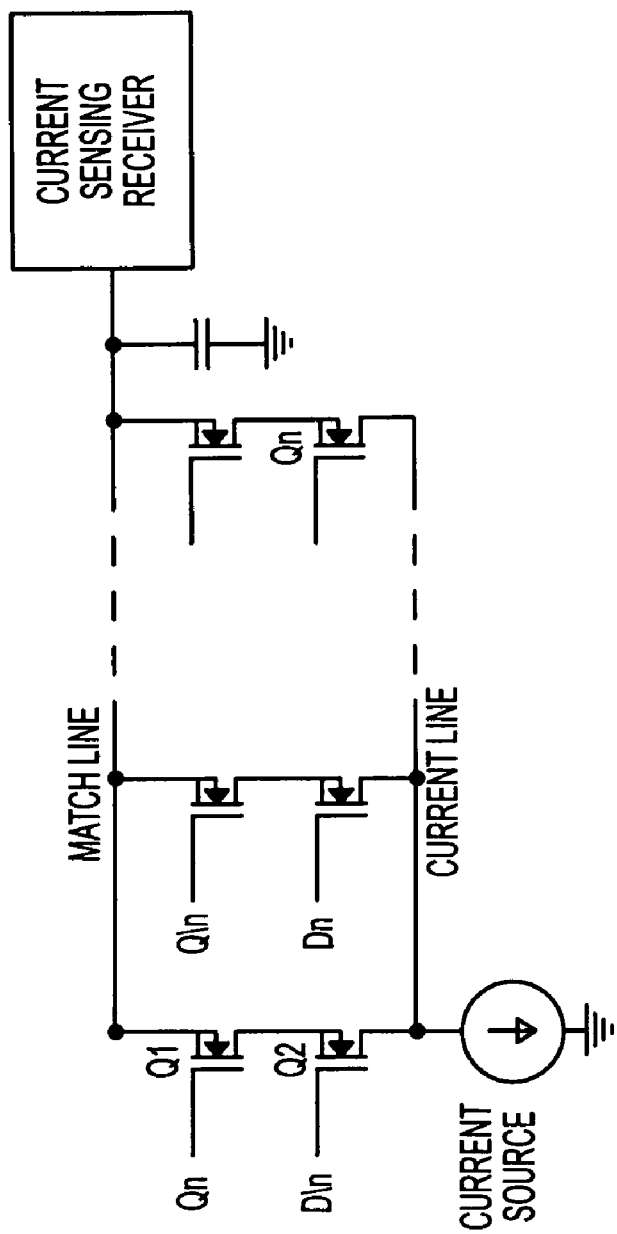
FIG. 2 is a current sensing amplifier known in the art.
Figure 3:
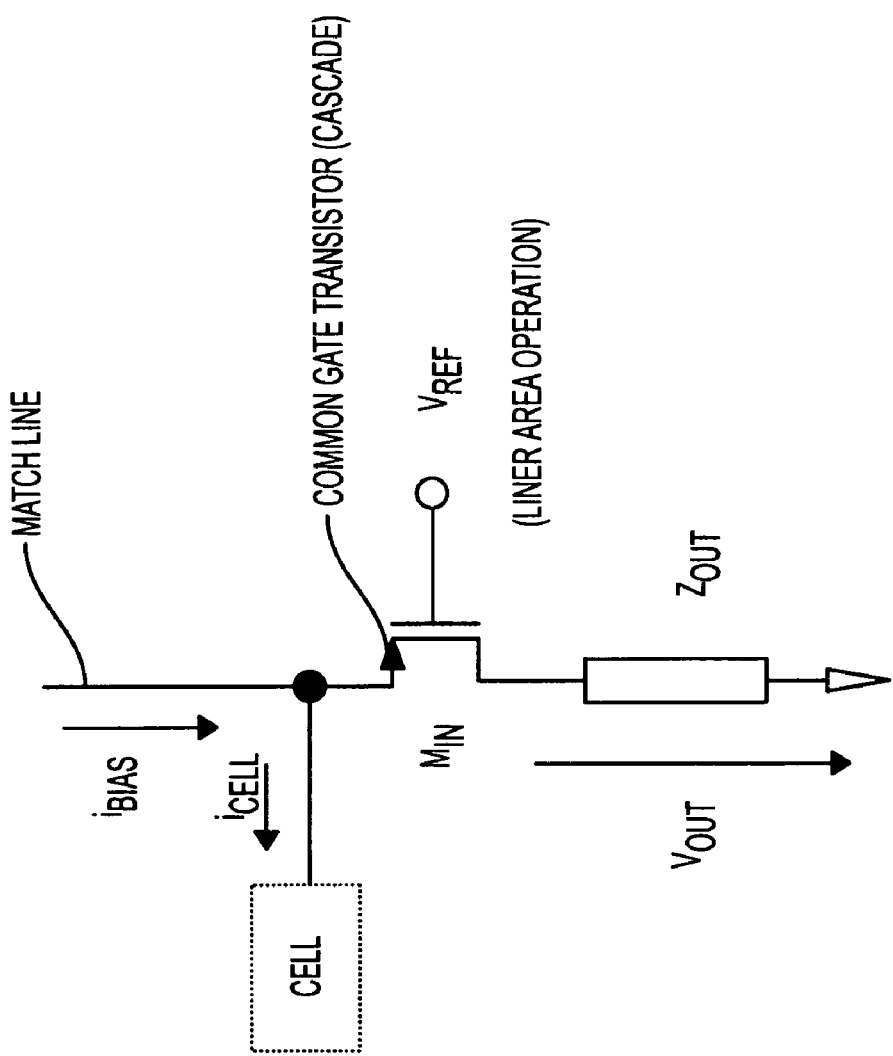
FIG. 3 is a schematic illustrating a conventional current sensing amplifier with a common gate stage in block diagram form.
Figure 4A:
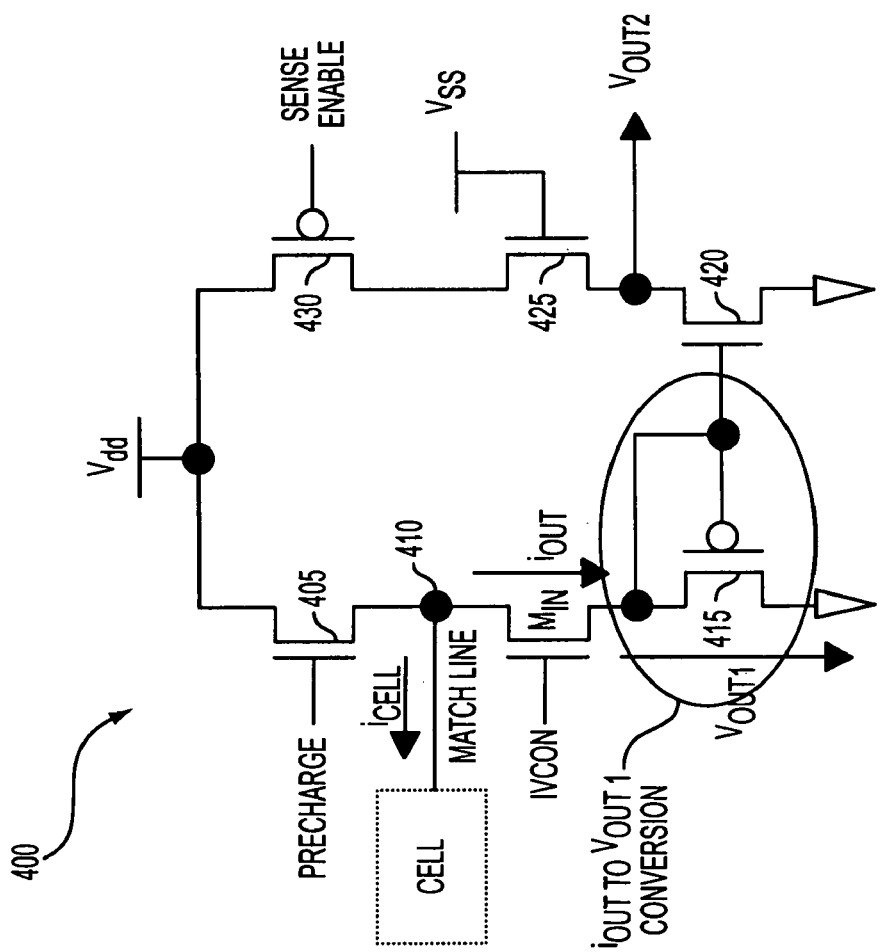
FIG. 4A is a schematic illustrating an exemplary embodiment of the present invention.

FIG. 4A illustrates a first exemplary embodiment of the hybrid current-voltage sense amplifier circuit 400 in accordance with the invention. The circuit is powered by a supply voltage $V_{dd}$ and includes a first amplifier leg provided between voltage source $V_{dd}$ and ground which contains serially connected N-channel precharged transistor 405, N-channel load transistor 410, and P-channel current-to-voltage transistor 415 connected as a diode. Circuit 400 also includes a second amplifier leg provided between voltage source $V_{dd}$ and ground and containing serially connected P-channel sense/enable transistor 430, N-channel load transistor 425 having a gate connected to a voltage source $V_{ss}$ and a N-channel output transistor 420 which supplies an output voltage $V_{out2}$ from the circuit. The gate of transistor 420 is connected to the gate of transistor 415 and thus receives an output voltage $V_{out1}$ which is developed across transistor 415 during circuit operation. A match line is connected between the serial connection of transistors 405 and 410.

Figure 4B:
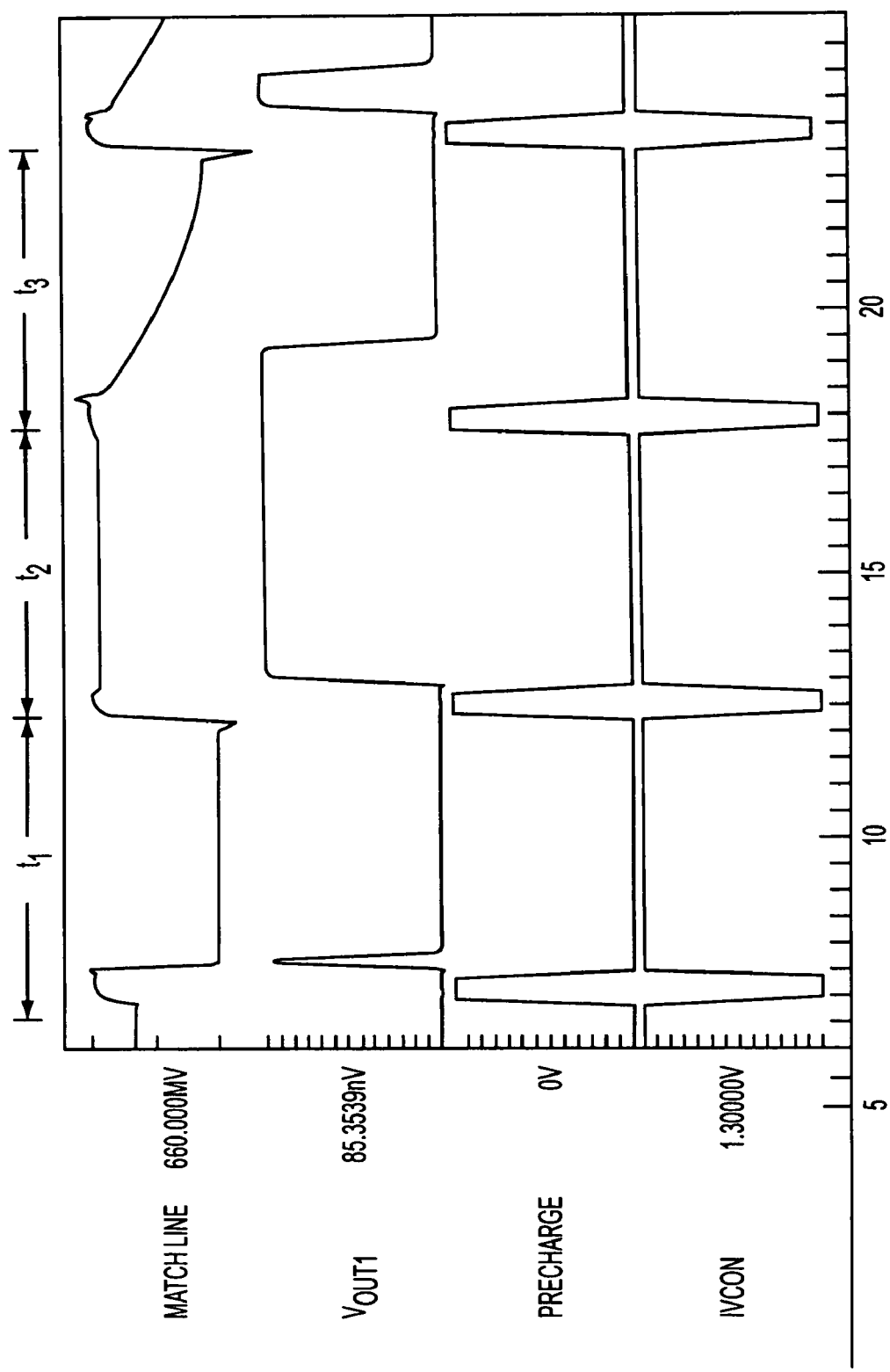
FIG. 4B is a timing diagram for the schematic of FIG. 4A of the present invention.

The operation of the FIG. 4B circuit will now be described in connection with the timing diagrams illustrated in FIG. 4B. FIG. 4B has been broken into three different conditions of operation denoted as $t_1$, $t_2$, and $t_3$. Time period $t_1$ indicates a condition where there are many bits of a CAM word, which mismatch a search word in a comparand register causing the match line to be pulled to ground very quickly. The second time period t2 represents a condition where there is a match of all bits in a CAM word with those bits contained in the word in a comparand register. Time period t3 indicates a condition where there are a few bit mismatches between the CAM word and the word stored in the comparand register.

Turning first to the operation during the time period $t_1$, operation begins when the precharge signal to transistor 405 is asserted high which causes the match line to precharge to a higher voltage as indicated at the beginning of period $t_2$ in FIG. 4B. After this, the current to voltage converting signal "ivcon" is asserted high which turns on transistor 410 and begins the current flow iout through transistor 415 acting as a diode. In the condition illustrated in the time period $t_1$, the match line has been pulled low very quickly and as a result the output voltage $V_{out1}$ also falls because most of the current split between $i_{cell}$ and $i_{out}$ flows through $i_{cell}$. The low voltage at $V_{out1}$ is, in turn, applied as a gate signal to transistor 420. Consequently, when a sense enable signal is asserted low on transistor 430, the low gate voltage at transistor 420 will produce a low output voltage $V_{out2}$ for the sense amplifier.

Returning to FIG. 4B, the time period $t_2$ illustrates a situation where the bits of the CAM word match those of the word stored in comparand register in which case after the match line is precharged by the precharge signal to transistor 405 being asserted high and thereafter the control signal "ivcon" is asserted high, a considerable current $i_{out}$ flows through transistor 415 producing a high voltage $V_{out1}$. This high output voltage is applied to the gate of transistor 420 and when the sense/enable signal subsequently is applied to turn on transistor 430, a large output voltage $V_{out2}$ is developed. Although the sense/enable signal is not illustrated in the timing diagram of FIG. 4B, it should be appreciated that it occurs during the operational time periods $t_1$, $t_2$ and $t_3$ at a time after the $V_{out1}$ voltage has been allowed to settle.

Referring again to FIG. 4B, the operation of the FIG. 4A circuit when a few bits of the CAM word mismatch those of the word stored in the comparand register is illustrated. In this situation, after the match line is precharged high, the voltage decreases slowly due to the current $i_{cell}$ being drawn due to the mismatched bits. Accordingly, the current $i_{out}$ even though decreasing somewhat more gradually than in the situation of the operational time period $t_1$, nevertheless the voltage developed from the current $i_{out}$ quickly drops to a low voltage which is applied to transistor 420 to produce a corresponding low output voltage at $V_{out2}$.

With the first embodiment of the invention illustrated in FIG. 4A, the circuit is quickly able to sense the condition of the match line whether just a few or many bits are mismatched between a CAM word (memory storage location) and a word stored in the comparand register.

Figure 5A:
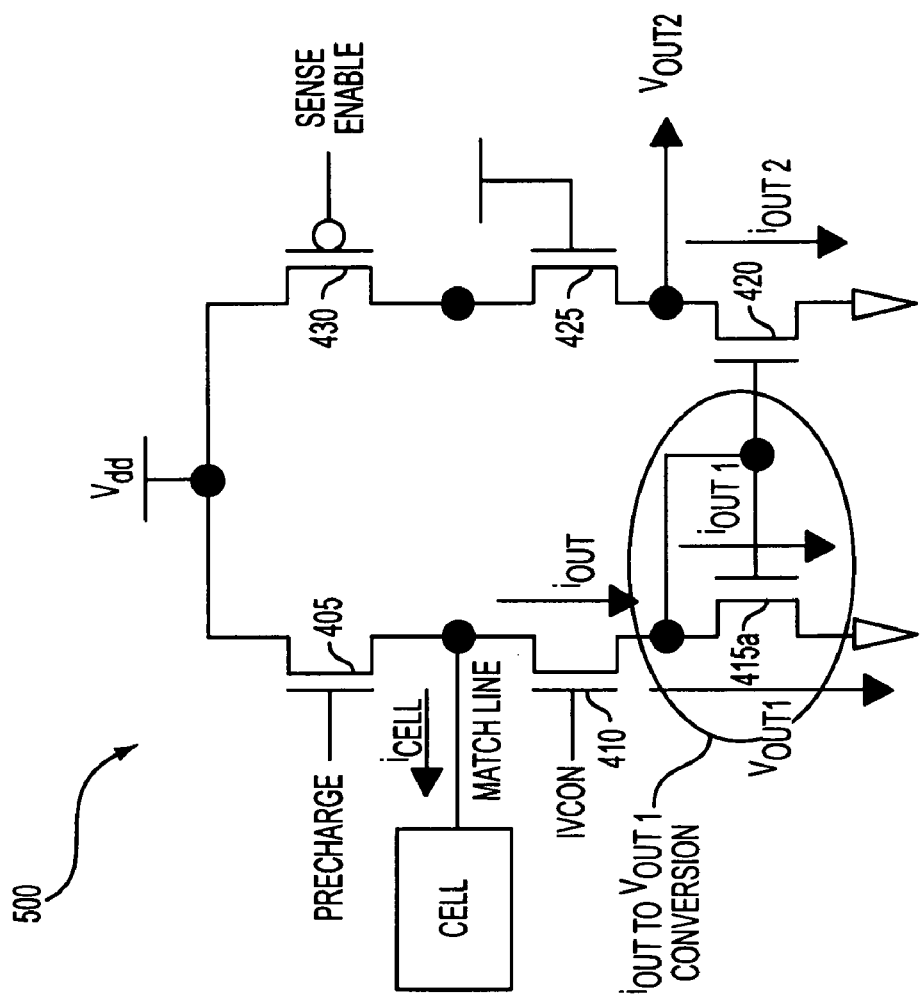
FIG. 5A is a schematic illustrating an alternative exemplary embodiment of the present invention.

FIG. 5A illustrates a second embodiment of the sense amplifier of the invention which differs from the FIG. 4A embodiment in the use of a N-channel transistor 415a in place of the P channel transistor 415.

Figure 5B:
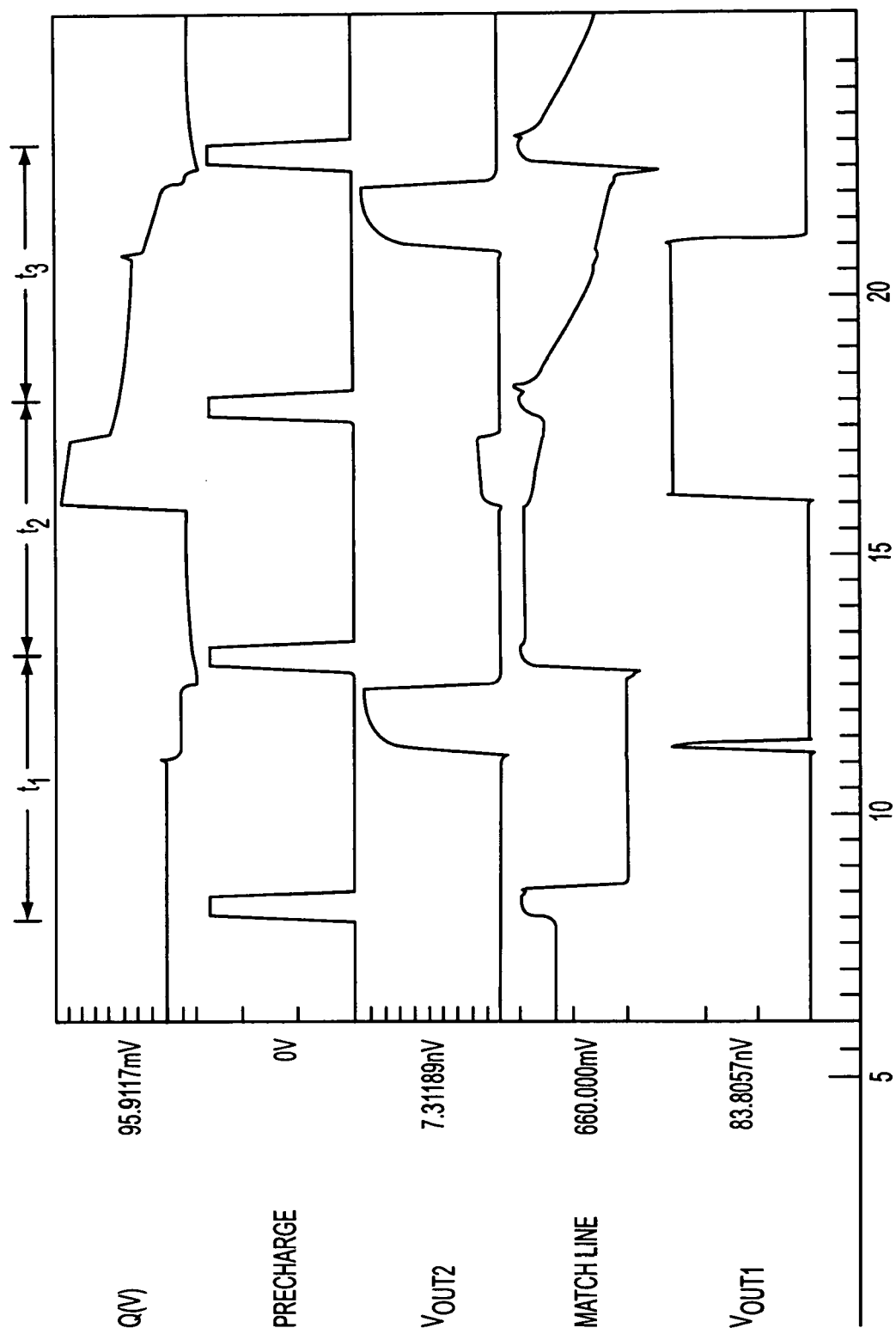
FIG. 5B is a timing diagram for the schematic of FIG. 5A of the present invention.

The circuit 500 of FIG. 5A operates similar to that if FIG. 4A as demonstrated by the timing diagram illustrated in FIG. 5B. It should be noted that in the FIG. 5B timing diagram the control signal "ivcon" has been omitted, but the output signal $V_{out2}$ is shown along with the precharge signal and the match line signal. Once again, as shown in FIG. 5B three different operations conditions are illustrated by the respective time periods $t_1$, $t_2$ and $t_3$. In operational time period $t_1$, the match line is pulled quickly low due to many of mismatching bits between the CAM word and the word stored in the comparand, while in operational time period $t_2$, the bits between the CAM word and that of the word stored in the comparand match, while in operational time period $t_3$, there are a few bits which mismatch.

It is also noted that transistors which are the same in FIGS. 4A and 5A have the same reference numbers and that only transistor 415, now designated as 415a in FIG. 5A, is different.

Referring to FIG. 5B, after transistor 405 is turned on by the precharge signal and the match line has been precharged to a high state, a significant number of bit mismatches in the memory cells causes the $i_{cell}$ current to be high relative to the $i_{out}$ current. As a consequence, $V_{out1}$ developed across transistor 415a is at a low voltage which in turn keeps transistor 420 off and when sense/enable signal is applied to transistor 430, this produces a high output voltage at $V_{out2}$.

During operational time period $t_2$, after the precharge signal is applied to transistor 405, there are no mismatched bits and accordingly the current $i_{out}$ is high producing a large voltage $V_{out1}$ which is turn turns on transistor 420 when sense/enable signal is applied to transistor 430 producing a low voltage at $V_{out2}$.

During operational time period $t_3$, after the signal is applied to transistor 405, there are a few mismatched bits between the CAM word and the word stored in the comparand register, $i_{out}$ drops, but not as fast as in operational state $t_1$. Nevertheless, the current iout is still sufficient to produce a large voltage $V_{out1}$ across transistor 415a which is applied to the transistor 420. However, at this time, the sense/enable signal has not yet applied to transistor 430. By the time the sense/enable signal is applied to transistor 430, the current $i_{out}$ has dropped sufficiently such that the $V_{out1}$ has also dropped to a point where the gate voltage at transistor 420 is insufficient to turn the transistor on. As a result, when the sense/enable signal is applied to transistor 430, transistor 420 remains off and the output voltage $V_{out2}$ is high.

Both embodiments shown in FIG. 4A and FIG. 5A of the invention monitor a current $i_{out}$ which is affected by the current flow icell through memory locations in accordance with the number of bits, which mismatch when there is a no match condition. Transistors 415 and 415a convert this current $i_{out}$ to a voltage $V_{out2}$ which is used to control the output voltage $V_{out2}$ when a sense/enable signal is applied to transistor 430. Both embodiments provide a simple, reliable and speedy circuit and operational method for sensing the state of the match line in a CAM memory device.

Figure 6:
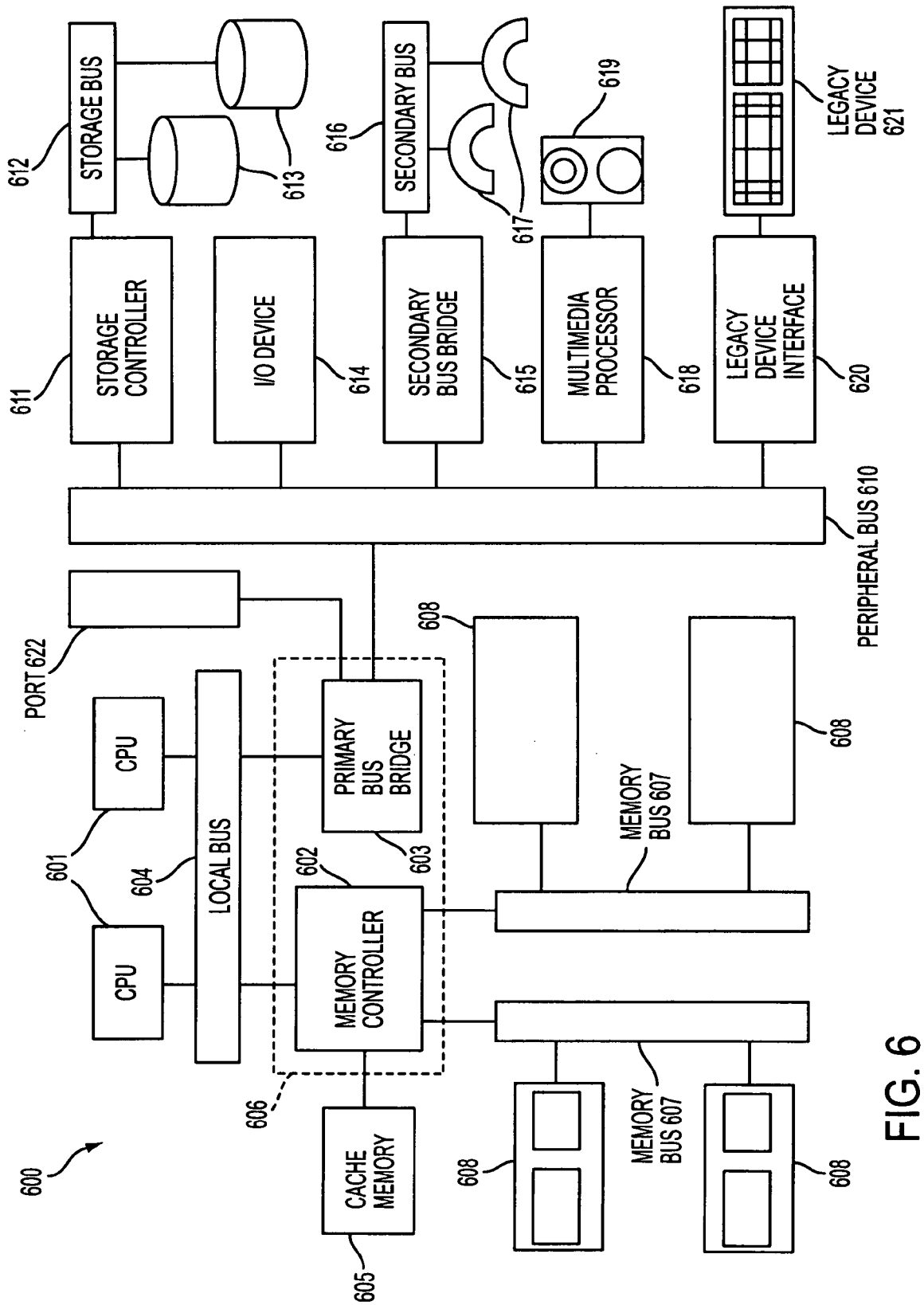
FIG. 6 is a block diagram of a processing system using the present invention.

FIG. 6 illustrates an exemplary processing system 600 which may utilize a processor coupled to a CAM or TCAM having a sense amplifier constructed in accordance with any of the embodiments of the present invention disclosed above in connection with FIGS. 4A–5B. The processing system 600 includes one or more processors 601 coupled to a local bus 604. A memory controller 602 and a primary bus bridge 603 are also coupled to the local bus 604. The processing system 600 may include multiple memory controllers 602 and/or multiple primary bus bridges 603. The memory controller 602 and the primary bus bridge 603 may be integrated as a single device 606.

The memory controller 602 is also coupled to one or more memory buses 607. Each memory bus 607 accepts memory components 608 which include at least one CAM or TCAM device having a hybrid current-voltage sense amplifier of the present invention. The memory components 608 may be a memory card or a memory module. Examples of memory modules include single inline memory modules (SIMMs) and dual inline memory modules (DIMMs). The memory controller 602 may also be coupled to a cache memory 605. The cache memory 605 may be the only cache memory in the processing system. Alternatively, other devices, for example, processors 601 may also include cache memories, which may form a cache hierarchy with cache memory 605. If the processing system 600 includes peripherals or controllers which are bus masters or which support direct memory access (DMA), the memory controller 602 may implement a cache coherency protocol. If the memory controller 602 is coupled to a plurality of memory buses 607, each memory bus 607 may be operated in parallel, or different address ranges may be mapped to different memory buses 607.

The primary bus bridge 603 is coupled to at least one peripheral bus 610. Various devices, such as peripherals or additional bus bridges may be coupled to the peripheral bus 610. These devices may include a storage controller 611, an miscellaneous I/O device 614, a secondary bus bridge 615, a multimedia processor 618, and an legacy device interface 620. The primary bus bridge 603 may also coupled to one or more special purpose high speed ports 622. In a personal computer, for example, the special purpose port might be the Accelerated Graphics Port (AGP), used to couple a high performance video card to the processing system 600.

The storage controller 611 couples one or more storage devices 613, via a storage bus 612, to the peripheral bus 610. For example, the storage controller 611 may be a SCSI controller and storage devices 613 may be SCSI discs. The I/O device 614 may be any sort of peripheral. For example, the I/O device 614 may be an local area network interface, such as an Ethernet card. The secondary bus bridge may be used to interface additional devices via another bus to the processing system. For example, the secondary bus bridge 616 may be an universal serial port (USB) controller used to couple USB bus devices 617 via to the processing system 600. The multimedia processor 618 may be a sound card, a video capture card, or any other type of media interface, which may also be coupled to one additional devices such as speakers 619. The legacy device interface 620 is used to couple legacy devices 621, for example, older styled keyboards and mice, to the processing system 600.

The processing system 600 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 600 to become more suitable for use in a variety of applications such as a network router, a database search engine or other applications. In addition, for use in a router, a simpler processor architecture may be used to couple the CAM or TCAM memory devices to a processor.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A method of sensing a state of a content addressable memory element, said method comprising the acts of:

generating a first control signal to initiate a precharge operation on a match line associated with said content addressable memory element;

generating a second control signal to cause current indicative of the state of the memory element to flow to a load and become a first voltage; and generating a third control signal to convert the first voltage to a second voltage.

2. The method of claim 1, further comprising the act of outputting the second voltage.

3. The method of claim 1, wherein the first control signal is a precharge control signal.

4. The method of claim 1, wherein the second control signal is a current flow control signal.

5. The method of claim 1, wherein the third control signal is a sense/enable control signal, which initiates a sense operation.

6. The method of claim 1, wherein said act of generating the second control signal further comprises the act of inputting the current from the memory element onto the precharged match line.

7. A method of sensing a state of a content addressable memory element, said method comprising the acts of:
   precharging a match line associated with said content addressable memory element to a precharge potential;
   receiving a current at a first node, the current corresponding to the state of the memory element;
   converting the current to a first voltage by applying the current to a diode;
   initiating a sensing operation; and
   converting the first voltage to a second voltage.

8. The method of claim 7, further comprising the act of outputting the second voltage.

9. The method of claim 7, wherein said initiating step comprises the act of generating a sense/enable signal.

10. The method of claim 7, wherein said receiving step comprises generating a control signal to input the current from the precharged match line.

11. The method of claim 7, wherein said step of converting the first voltage to the second voltage comprises applying the first voltage to a transistor that controls the flow of a second current at a second node.

* * * * *

UNITED STATES PATENT AND TRADEMARK OFFICE
CERTIFICATE OF CORRECTION

PATENT NO. : 7,068,527 B2  Page 1 of 1
APPLICATION NO. : 11/043437
DATED : June 27, 2006
INVENTOR(S) : Hong-Seok Kim It is certified that error appears in the above-identified patent and that said Letters Patent is hereby corrected as shown below:

Column 4, line 7, "iout" should read --$i_{out}$--;

Column 5, line 36, "icell" should read --$i_{cell}$--;

Column 6, line 13-14, "an miscellaneous" should read --a miscellaneous--;

Column 6, line 15, "an legacy" should read --a legacy--;

Column 6, line 16, "also coupled" should read --also be coupled--;

Column 6, line 26, "an local" should read --a local--;

Column 6, line 30, "an universal" should read --a universal--;

Column 6, line 31, "via to the" should read --via the--; and

Column 6, line 34, "to one additional" should read --to additional--.

Signed and Sealed this

Thirty-first Day of October, 2006

JON W. DUDAS
*Director of the United States Patent and Trademark Office*